United States Patent
Shanov et al.

(10) Patent No.: US 9,796,121 B2
(45) Date of Patent: Oct. 24, 2017

(54) METHODS OF GROWING CARBON NANOTUBES AND FORMING A CARBON NANOTUBE THREAD

(71) Applicant: University Of Cincinnati, Cincinnati, OH (US)

(72) Inventors: Vesselin N. Shanov, Cincinnati, OH (US); Mark J. Schulz, West Chester, OH (US)

(73) Assignee: University of Cincinnati, Cincinnati, OH (US)

( * ) Notice: Subject to any disclaimer, the term of this patent is extended or adjusted under 35 U.S.C. 154(b) by 0 days.

(21) Appl. No.: 14/396,962

(22) PCT Filed: Apr. 26, 2013

(86) PCT No.: PCT/US2013/038316
§ 371 (c)(1),
(2) Date: Oct. 24, 2014

(87) PCT Pub. No.: WO2013/163493
PCT Pub. Date: Oct. 31, 2013

(65) Prior Publication Data
US 2015/0137414 A1    May 21, 2015

Related U.S. Application Data

(60) Provisional application No. 61/638,532, filed on Apr. 26, 2012.

(51) Int. Cl.
*D01D 5/00* (2006.01)
*D02G 3/16* (2006.01)
(Continued)

(52) U.S. Cl.
CPC ........... *B29C 47/0014* (2013.01); *B01J 23/75* (2013.01); *B01J 35/002* (2013.01);
(Continued)

(58) Field of Classification Search
CPC ... B01J 21/04; B01J 21/06; B01J 21/08; B01J 23/745; B01J 23/75; B01J 37/0215;
(Continued)

(56) References Cited

U.S. PATENT DOCUMENTS

2004/0241080 A1* 12/2004 Nagy ................. C01B 31/0233
423/447.3
2006/0008408 A1* 1/2006 Ho Yoon ............ C01B 31/0233
423/447.3 X
(Continued)

FOREIGN PATENT DOCUMENTS

WO    2008153609 A1    12/2008

OTHER PUBLICATIONS

International Search Report in Corresponding International Application No. PCT/US2013/038316, 2 pgs (dated Aug. 26, 2013).

*Primary Examiner* — Leo B Tentoni
(74) *Attorney, Agent, or Firm* — Wood Herron & Evans LLP (57) ABSTRACT

A method of forming an array of aligned, uniform-length carbon nanotubes on a planar surface of a substrate employing a composite catalyst layer of iron and cobalt. The carbon nanotubes have visible length and are useful for producing spun threads of carbon nanotubes having improved spinability and mechanical and electrical properties.

18 Claims, 5 Drawing Sheets

(51) Int. Cl.
- B29C 47/00 (2006.01)
- B01J 37/02 (2006.01)
- C01B 32/162 (2017.01)
- B01J 37/12 (2006.01)
- B01J 37/16 (2006.01)
- B01J 37/34 (2006.01)
- B01J 23/75 (2006.01)
- B01J 35/00 (2006.01)
- B82Y 30/00 (2011.01)
- C01B 31/02 (2006.01)
- D01F 9/12 (2006.01)
- B82Y 40/00 (2011.01)
- C23C 14/35 (2006.01)
- B01J 21/04 (2006.01)
- B01J 21/08 (2006.01)
- B29K 103/04 (2006.01)
- B29L 31/00 (2006.01)

(52) U.S. Cl.
CPC ....... *B01J 37/0226* (2013.01); *B01J 37/0228* (2013.01); *B01J 37/12* (2013.01); *B01J 37/16* (2013.01); *B01J 37/349* (2013.01); *B82Y 30/00* (2013.01); *B82Y 40/00* (2013.01); *C01B 31/0233* (2013.01); *C01B 32/162* (2017.08); *C23C 14/35* (2013.01); *D01F 9/12* (2013.01); *B01J 21/04* (2013.01); *B01J 21/08* (2013.01); *B29K 2103/04* (2013.01); *B29L 2031/731* (2013.01); *C01B 2202/08* (2013.01)

(58) Field of Classification Search
CPC ............. B01J 37/0225; B01J 37/0226; B01J 37/0228; B01J 37/12; B01J 37/16; B29C 47/0014; C01B 31/022; C01B 31/0226; C01B 31/0233; D01D 5/00; D01F 9/12; D02G 3/16; D10B 2101/122
USPC .......... 264/103, 164; 423/447.1, 447.3; 502/326, 338
See application file for complete search history.

(56) References Cited

U.S. PATENT DOCUMENTS

| | | |
|---|---|---|
| 2006/0133982 A1 | 6/2006 | Kinloch et al. |
| 2008/0095695 A1 | 4/2008 | Shanov et al. |
| 2008/0181839 A1 | 7/2008 | Arendt et al. |
| 2009/0075035 A1 | 3/2009 | O'Brien et al. |
| 2012/0064332 A1 | 3/2012 | Malet et al. |
| 2012/0144984 A1* | 6/2012 | Head, III ............. D02G 3/16 87/8 |

* cited by examiner

METHODS OF GROWING CARBON NANOTUBES AND FORMING A CARBON NANOTUBE THREAD

BACKGROUND OF THE INVENTION

Carbon nanotubes are used for a variety of applications such as in sensors, reinforcement in composite materials, and the like. Although there are many different ways to form carbon nanotubes, there are two distinct types of carbon nanotubes, individual nanotubes formed by bulk synthesis and arrays of nanotubes formed by surface or oriented synthesis. The individual nanotubes are much like spaghetti where each nanotube is grown with random orientation. Arrays of aligned nanotubes may include literally billions of nanotubes side-by-side, formed on a substrate.

It has always been a goal to form longer and longer carbon nanotubes. If longer arrays of carbon nanotubes are formed, one can spin nanotubes into fibers that may be stronger and lighter than any existing fibers and that are electrically conductive.

The short length of carbon nanotubes has been a roadblock to many of their applications. Growth of carbon nanotubes with controlled morphology is an intensively investigated area. The ability to grow carbon nanotube arrays having a homogeneous and uniform structure over a large surface area greater than one square centimeter would enable carbon nanotube arrays to be used in many different structural and sensing applications.

Carbon nanotubes have been traditionally formed by chemical vapor deposition of carbon on a catalytic substrate. One effective catalytic substrate is iron. Nickel and cobalt have also been used successfully.

PCT Patent Publication 2008/105936 and US Patent Publication 2008/0095695, the disclosures of which are incorporated by reference in their entireties, disclose a catalyst composition for growing an array of aligned carbon nanotubes on a substrate having lengths greater than 1 millimeter up to and exceeding 2 centimeters, using a composite catalyst comprising a group VIII element and a non-catalytic element, preferably a lanthanide group metal. Exemplified are composite catalysts comprising iron (Fe) and a lanthanide group metal.

Notwithstanding the improvements in growing longer carbon nanotubes, a need remains for growing long, aligned arrays of carbon nanotubes that can be processed into carbon nanotube threads, yearns and other elongate structures.

SUMMARY OF THE INVENTION

This invention provides a method and system for growing an array of long, aligned and substantially uniform-length carbon nanotubes (CNT arrays) that can be harvested and converted into CNT threads, yarns, braids, ropes and other elongate structures, using an composite catalyst comprising an iron element and a cobalt element. The CNT arrays are grown on the composite catalyst in a vapor deposition process. The grown carbon nanotubes are predominantly double-walled (MWCNT) with reasonable electrical and mechanical properties.

The composite catalyst on the substrate is a layered thin-film structure comprising a combination of iron and cobalt (Fe—Co). While both metals have been used in catalytic reactions for making CNT, their specific use as a composite catalyst has not been described. The composite catalyst structure can comprise one or more separate layers of iron and of cobalt, or one or more distinct layers of an alloy of iron or cobalt.

In another aspect of the invention, the Fe—Co composite catalyst is formed as a layer upon an oxidized alumina layer of a planar (wafer) substrate. In another aspect, the Fe—Co composite catalyst is at least partially oxidized by thermal treatment in air. The oxidized Fe—Co composite catalyst layer is then reduced to the elemental form prior to introducing carbonaceous reactant gases to grow the carbon nanotube array.

Additional aspects and advantages of the present invention will be further appreciated in light of the following detailed description and drawings in which:

DETAILED DESCRIPTION

A. Growing Arrays of Carbon Nanotubes

Carbon nanotubes can be grown in an oriented synthesis, wherein the grown carbon nanotubes are aligned of substantially the same length in the form of an array or "carpet" of CNTs on a substrate that has at least one planar surface. The array contains many carbon nanotubes grown in one direction. There are a variety of carbon nanotube morphologies. Carbon nanotubes are usually categorized according to the number of walls that the carbon nanotube has. For example, there are multi-walled carbon nanotubes (MWCNT), double-walled carbon nanotubes (DWCNT), and single-walled carbon nanotubes (SWCNT). As used herein, carbon nanotubes refer to array of grown carbon nanotubes consisting substantially of DWCNT, and with minor amounts or no amount of MWCNT and SWCNT, unless otherwise stated.

An important advantage of the array of aligned, elongated CNT is their capability of being processed, and in particular harvested from the substrate resulting from an improvement in spinability of the grown CNTs, into CNT threads, yarns, braids, ropes and wires (which may collectively be referred to hereinafter as CNT elongates). Such processes include various processing steps, including the extraction of the CNTs from the surface of the substrate on which they are grown, the pulling of this bunch of extracted CNTs into ribbons, and the twisting or spinning of the CNT bunch(es) or CNT ribbon into a continuous CNT thread. The CNT thread or threads are then subsequently processed into larger (cross-sectional-wise) and longer CNT yarn, CNT braids, CNT ropes and CNT wires. It has been determined that the conditions and design of the substrate on which the CNTs are grown, including the thickness and composition of catalyst, and the thickness of the buffer layer on which the catalyst resides, affect the diameter and other properties of the CNT, and that these properties of the CNT, including the density of the CNT arrays (number of CNT per unit area), have a significant impact on spinability.

Figure 1:
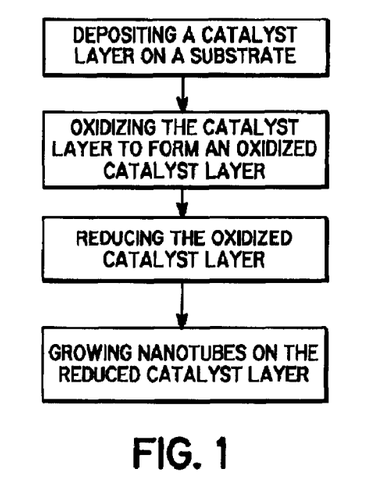
FIG. 1 is a process flow diagram of an embodiment of the method of the invention.
Figure 2:
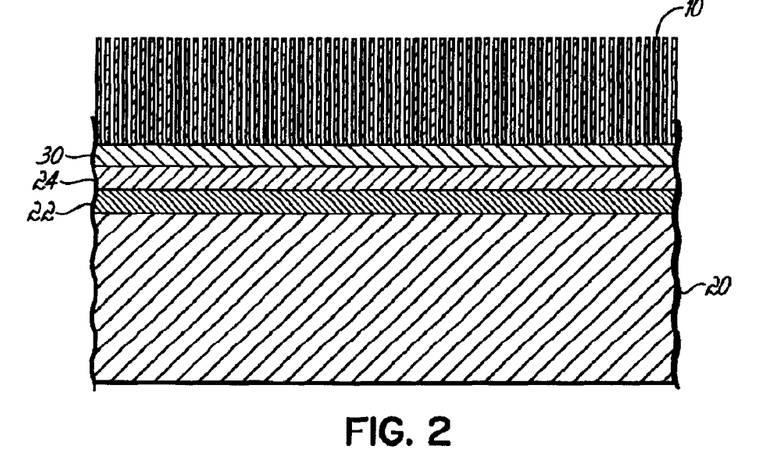
FIG. 2 is a cross-sectional view of an embodiment of a substrate with a composite catalyst layer having a plurality of carbon nanotubes formed thereon.

With reference to FIGS. 1 and 2, in an aspect of the invention, a carbon nanotube array 10 is formed on a substrate 20 that is compatible with a vapor deposition process. Initially a composite catalyst layer 30 is deposited on the substrate 20 which includes a silicon dioxide layer 22 and an alumina layer 24, as shown in FIG. 2. There are a variety of vapor deposition processes to deposit and treat the various layers of substrate 20. By way of example and not limitation, electron beam deposition, thermal evaporation, spin coating, electrochemical deposition, electroless deposition, plasma spray deposition, magnetron sputtering, pulsed laser deposition (PLD), and chemical vapor deposition (CVD), among others. While reference may be made specifically to CVD, this term includes known modifications to CVD including, for example, plasma enhanced CVD, microwave CVD, and laser enhanced CVD. In addition, other vapor deposition processes may be utilized to grow carbon nanotubes according to the aspects of the present invention.

(1) Substrate

The substrate 20 is the support structure on which the CNTs are grown and from which the array of CNTs are harvested or processed. The substrate is typically a planar structure. The substrate can be a single crystal silicon wafer because its use in chemical vapor deposition is very well documented. However, any inert substrate can be used, such as ceramics, quartz, polycrystalline silicon, sapphire, alumina, and the like. When the substrate is silicon, it is treated to form the layer of silicon dioxide on its planar surface. The thickness of the oxidized Si layer is typically at least about 0.5 microns (500 nm).

Other examples of substrates can include plates or sheets of metals, including stainless steel, steel, nickel, titanium, nickel-chromium alloys, or mixtures thereof, and can include a geometric shape of a substrate, such as a rectangle, square or circle, or a continuous roll or sheet of substrate. Examples of metal substrates, and the metals for forming planar substrates, are described in US Patent Publication 2012-0058352 and US Patent Publication 2011-0230373, the disclosures of which are incorporated by reference in their entireties.

A thin film of aluminum is then deposited by, for example, electron beam deposition onto the silicon dioxide layer 22. The thickness of the deposited aluminum layer is less than about 0.5 microns, though is preferably about and less than 50 nm. Generally, it will be from about 10 nm to about 20 nm, with 15 nm preferred.

The aluminum is oxidized by plasma oxidation to form the aluminum oxide layer 24, also referred to as alumina, which forms a buffer layer between the composite catalyst and the substrate base. The alumina layer 24 provides a porous surface. This, in effect, creates microscopic cavities throughout the surface of the substrate. These cavities accommodate the composite catalyst layer 30, forming a staging area for nucleation and growth of the nanotube.

The aluminum oxide layer 24 can also be formed by other thin film deposition methods such as direct magnetron sputtering of aluminum oxide, or direct chemical vapor deposition of aluminum oxide.

(2) CNT Catalyst

The composite catalyst layer 30 is then deposited onto a substrate 20 with an silicon dioxide layer 22 and an aluminum oxide layer 24 deposited thereon. The composite catalyst 30 comprises iron (Fe) and cobalt (Co). The weight percent (wt. %) ratio of iron to cobalt as the composite catalyst substrate can vary from 1/99 to 99/1. The weight percent ratios that are more effective in producing elongated, aligned carbon nanotubes that have improved spinability properties, include 20/80, 50/50, and 95/5, with about 50/50 being typical.

An iron catalyst is understood to provide a rapid growth rate with a multi-wall structure, and a low growth density (CNTs per unit area), while cobalt is believed to promote slower growth rate of smaller diameter CNTs and a higher growth density. Without being bound by any particular theory, a composite iron and cobalt catalyst was theorized to provide a fast growing, small density CNT with a high growth density.

In addition, other minor levels of catalyst metal may be included in the composite catalyst, including nickel (Ni), ruthenium (Ru), rhodium (Rh), palladium (Pd), osmium (Os), iridium (Ir), and platinum (Pt), or combinations of these.

In addition to iron and cobalt, the composite catalyst layer 30 can optionally include a non-catalytic metal, including a lanthanide, for example lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Other inert metals such as gold can also optionally be used. Examples of composite catalysts include a catalyst composition comprising iron, cobalt, and lanthanum (La), a catalyst composition comprising iron, cobalt, and cerium (Ce), a catalyst composition comprising iron, cobalt, and gadolinium (Gd), and a catalyst composition comprising iron, cobalt, and neodymium (Nd).

Figure 3:
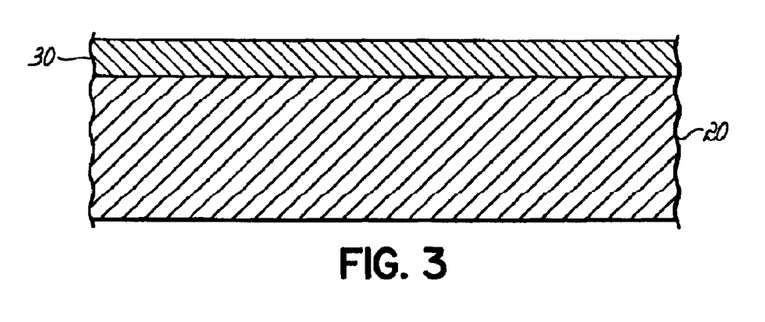
FIG. 3 is a cross-sectional view of another embodiment of the substrate having the composite catalyst layer deposited from an alloy comprising an iron and cobalt.

The composite catalyst layer 30 can be deposited by any well-known method, such as e-beam deposition, magnetron sputtering, or chemical vapor deposition, in one of at least two manners. In order to achieve the desired catalyst ratio, an alloy of iron and cobalt can be used to deposit the composite catalyst layer 30. The composite catalyst layer 30 may also be formed by simultaneously sputtering from multiple sputtering targets. The elements sputtered from the targets may then combine on the substrate 20, as shown in FIG. 3. Though FIG. 3 shows the composite catalyst 30 disposed on the substrate 20, it is understood that the composite catalyst 30 can be deposited over an alumina buffer layer 24, as shown in FIG. 2.

Figure 4:
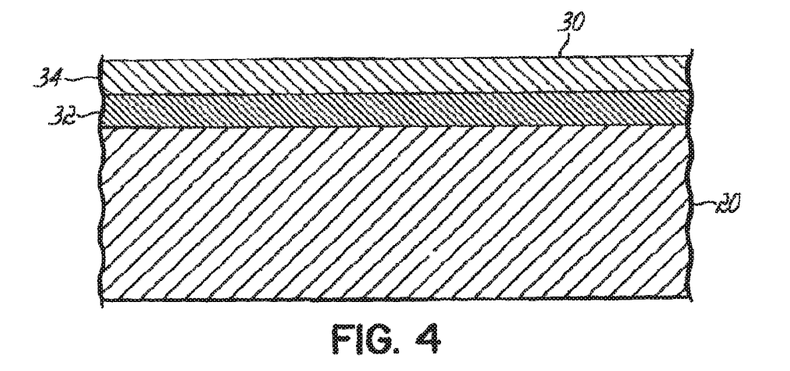
FIG. 4 is a cross-sectional view of another embodiment of the substrate wherein the composite catalyst layer includes alternating layers of iron and cobalt.

As shown in FIG. 4, the composite catalyst layer 30 may also be formed by depositing alternating layers of iron element and cobalt element. The first layer 32 comprises iron with the second layer 34 comprising cobalt. Conversely, first layer 32 can comprise cobalt with the second layer 34 comprising iron. The amount or weight percent ratio of the two metals, i.e., iron and cobalt is controlled by the thickness of the layer. Though FIG. 4 shows the composite catalyst 30 disposed on the substrate 20, it is understood that the composite catalyst 30 can be deposited over an alumina buffer layer 24, as shown in FIG. 2.

Figure 5:
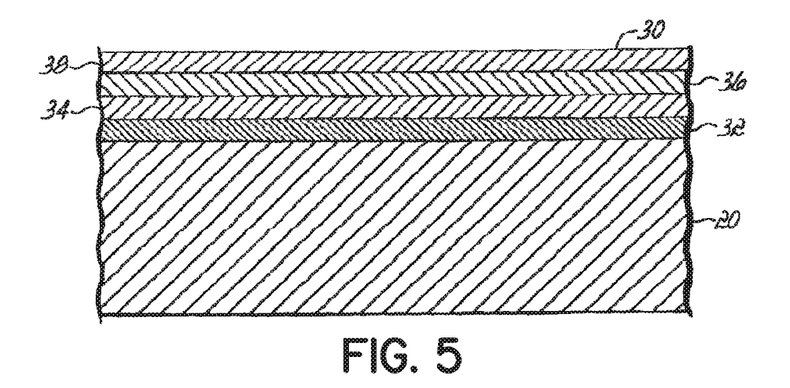
FIG. 5 is a cross-sectional view of another embodiment of the substrate wherein the composite catalyst layer includes three alternating layers of the iron element and the cobalt element.

As shown in FIG. 5, multiple alternating layers can be deposited onto one another. FIG. 5 is an illustration of four alternating layers. Again, the thickness and number of layers determine the amount of iron element and cobalt element deposited. The composite catalyst layer 30 may also comprise an odd number of layers, for example three layers. Thus, the amount of iron element relative to the amount of the cobalt element may be modified by changing the number of layers of either the iron element or the cobalt element. In addition, the individual thicknesses of the layers may be changed to bring about a particular mass ratio of the iron element to cobalt element in the catalytic layer 30.

The applied thickness of the composite catalyst layer 30 should be at least about 0.5, and up to about 5 nanometers (nm), with between about 1 and about 2 nm being preferred. Thus, the thickness of layers 32 and 34 shown in FIG. 4 should each measure about 1 nm. One preferred structure includes one layer comprising iron having a thickness of about 1 nm and one layer of cobalt having a thickness of 1 nm. In this case, the weight percent ratio of iron to cobalt is about 50/50 since the iron and cobalt densities are approximately the same. With reference to FIG. 5, another preferred structure includes four alternating layers of iron and cobalt, each about 0.5 nm thick. For example, a first layer 32 may comprise iron, a second layer 34 may comprise cobalt, a third layer 36 may comprise iron, and a fourth layer 38 may comprise cobalt, such that the individual thicknesses total about 2 nm. More layers are possible, however, controlling the thickness uniformity becomes increasingly more difficult for layers with thicknesses of 0.5 nm and less. Even though alternating layers are described, the layers may be deposited in different orders.

An optional third catalytic component can be added to the composite catalyst layer 30. The third component can be an additive catalyst typically used in CNT growth. These include, for example, yttrium (Yt) and tantalum (Ta), as well as scandium (Sc), titanium (Ti), vanadium (V), chromium (Cr), manganese (Mn), zirconium (Zr), niobium (Nb), molybdenum (Mo), hafnium (Hf), tungsten (W), and rhenium (Rh). These can be added to the composite catalyst layer 30 in the same manner as the iron and the cobalt elements.

Figure 6:
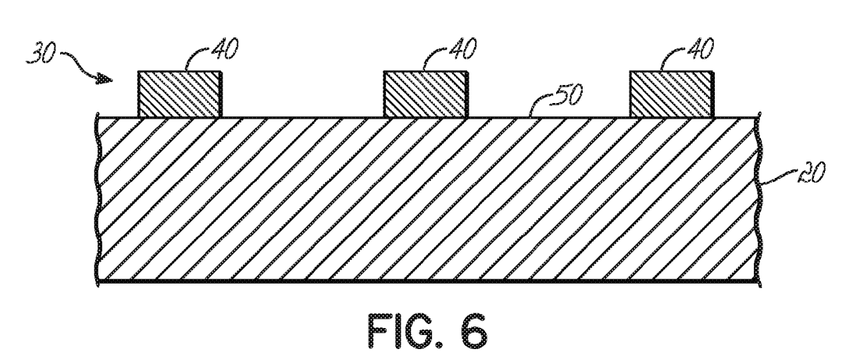
FIG. 6 is a cross-sectional view of another embodiment of the substrate having a discontinuous composite catalyst layer patterned on the substrate.

As shown in FIG. 6 the composite catalyst layer 30 may be deposited as a discontinuous layer, i.e., in a pattern. The pattern may have a plurality of coated areas 40 of the iron element and the cobalt element deposited from the alloy, again with a total thickness preferably of about 2 nm. The coated areas 40 may be separated a distance by an uncoated area 50. Preferably, the areas of catalyst deposition are separated from each other by a separation spacing distance of about 0.01 to about 3 millimeters. One preferred pattern consists of 1 millimeter diameter circles of catalyst separated by about 1 millimeter of uncoated substrate, although other patterns are possible. In addition, as illustrated for the continuous composite catalyst, the pattern may be deposited as a plurality of alternating layers of the iron catalyst and the cobalt element. Therefore, in one embodiment, the coated areas have a first layer and a second layer, with total height of, for example, about 2 nm. Similarly, the catalytic layer 30 may include four alternating group iron/cobalt layers, with the total height of the coated area being between about 0.5 nm and about 5 nm, with about 2 nm being preferred.

Once the composite catalyst layer 30 is deposited, it is desirable to break up or segregate the composite catalyst layer 30 into small particles (nanoclusters). This can be accomplished by heating (annealing) the composite catalyst layer 30 in an air environment at a temperature of between approximately 300° C. to about 900° C., preferably between about 500° C. to about 800° C. most preferably about 400° C. for about 5 hours. This treatment will at least partially oxidize the iron element and cobalt element, and cause them to form a uniform distribution of small (about 4 nm to about 40 nm) nanoclusters of the composite catalyst in a layer.

The size of the small nanoclusters of the composite catalyst layer 30 may be influenced by the melting temperature of the composite catalyst layer 30. As the melting temperature of the composite catalyst layer 30 decreases, the nanoclusters may decrease in size. The smaller nanoclusters produce smaller diameter carbon nanotubes and promote DWCNT growth. The melting point may be reduced by depositing different metals which have a low melting temperature or alloys forming low temperature eutectics. For example, an iron-cobalt alloy will have a lower melting point than pure iron or pure cobalt. Thus, a catalyst deposited from such an alloy or deposited as alternating layers will have a lower melting point than pure iron. The oxidized composite catalyst layer is later reduced forming the metal catalyst nanoclusters prior to growing the carbon nanotube array 10. The oxidized composite catalyst layer is preferably reduced by heating the composite catalyst layer 30 to about 700° C. in hydrogen.

(3) Growing CNTs

The carbon nanotube array 10 is grown by thermal chemical vapor deposition utilizing a gas mixture of hydrogen, ethylene, water, and argon.

In a non-limited example of the invention, an EasyTube™ Furnace from First Nano, Inc. can be used, although other known methods of depositing carbon nanotubes can be employed. In one preferred embodiment, the chemical vapor deposition is initiated with an argon flow at about 400° C. followed by hydrogen flow at about 700° C. to convert the iron oxide and cobalt oxide back to elemental iron and cobalt.

The actual growth of the carbon nanotubes starts when a mixture of hydrogen, ethylene, water, and argon is applied at a temperature of 700° C. to 800° C., preferably about 750° C. Besides ethylene, other carbon precursors, such as methane, acetylene, methanol, ethanol and carbon monoxide may be used. The water may be supplied by flowing argon through a water bubbler operating at room temperature. The gas flow is introduced into the reactor for about 10 hours or until carbon nanotube growth stops.

The mixture of the gases flowing into the reactor can be varied while achieving the growth of spinable CNTs.

The flux of carbon to the catalyst particle influences the formation of carbon nanotubes. The water in the reaction gas is designed to drive off unwanted amorphous carbon that can block the catalyst function. Therefore, about 150 sccm of argon carrier gas is passed through a bubbler to carry a sufficient amount of water to remove the amorphous carbon but not the graphitic carbon that forms the carbon nanotubes. The carbon nanotubes continue to grow as long as the carbon vapor deposition continues. Before the growth stops, additional catalysts can be added to promote further growth. Specifically, ferocene or iron pentacarbonyl can be added to the gaseous reaction mixture, which will then deposit iron onto the surface of the nanotubes, which will act as a catalyst to further increase growth.

The carbon nanotubes grown in accordance with another embodiment of the method a composite catalyst layer 30 as shown in FIG. 3 deposited from an alloy of the iron element and the cobalt element, for example from an alloy of iron and cobalt. Thus, the iron and cobalt are deposited substantially simultaneously.

Generally the CNTs exhibit a diameter of at least about 10 nanometers, and up to about 50 nanometers, including CNTs of about 20 nanometers, about 25 nanometers, about 30 nanometers, about 35 nanometers, about 40 nanometers, and about 45 nanometers.

In another embodiment with the composite catalyst layer 30 deposited, as shown in FIG. 5 with one layer of iron of about 1 nm with one layer of cobalt about 1 nm thick on top, the CNTs have diameters of about 15 nm. DWCNTs and some MWCNTs grow when the composite catalyst layer 30 is deposited in a larger number of alternating layers of iron and cobalt, as illustrated in FIG. 5. While the alternating layers, previously described, are more cost effective than the alloy, they also generally grow carbon nanotubes having lengths greater than the carbon nanotubes grown on the composite catalyst layer 30 deposited from the alloy.

Figure 7:
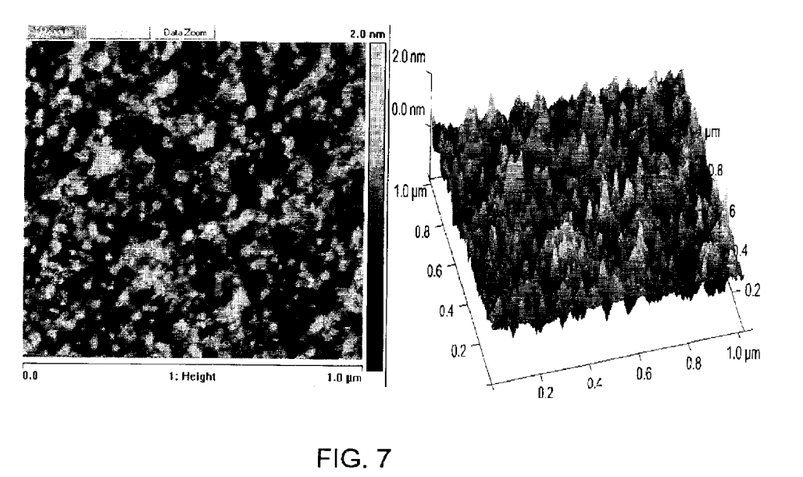
FIG. 7 shows an AFM image of a Fe—Co catalyst alloy after thermal annealing.

SWCNTs may grow by controlling the composition of the composite catalyst layer 30, the structure of the composite catalyst layer 30, annealing of the composite catalyst layer 30, the nature of the carbon precursor, and the growth conditions in the reactor. The composition of the composite catalyst layer 30 can affect the number of walls of the carbon nanotube. The atomic radius of the iron and the cobalt elements also affects proportionately the size of the catalyst nanoparticles produced during annealing of the composite catalyst layer. The smaller sized catalyst particles (nanoclusters) produce smaller diameter carbon nanotubes. The layered structure of the catalyst also influences the size of the carbon nanotubes. An annealing temperature that produces smaller particles during the thermal treatment in air may permit SWCNTs and DWCNTs to grow, preferably the catalyst particles produced should be below 5 nm in size. To produce small catalyst particles the annealing temperature during a short thermal treatment of 10 minutes should preferably below about 600° C. FIG. 7 shows Atomic Force Microscopy (AFM) images of the catalyst surface after annealing the substrate having an iron-cobalt composite catalyst, showing uniform distribution of the catalyst particles.

Chemical Vapor Deposition (CVD) parameters have been determined for the Fe—Co catalyst to synthesize well aligned and high purity DWCNTs arrays with spinable properties. It was found that CNT thread with a diameter from 10 μm to 70 μm can be spun from long, aligned nanotube arrays. The optimization of CVD parameters such as ethylene ($C_2H_4$) partial pressure, water ($H_2O$) to ethylene ($C_2H_4$) ratio, and hydrogen ($H_2$) to ethylene ($C_2H_4$) ratio for synthesis of long, spinable CNT arrays can significantly affect the growth of spinable CNT arrays.

The carbon precursors, like ethylene and acetylene, are reactive at elevated temperatures and have higher decomposition rates and are likely to grow MWCNT because they generate higher carbon flux. To grow SWCNT and DWCNT, the amount of reactive carbon is reduced by selecting a more appropriate precursor, such as methane. Methane is more thermally stable than ethylene and acetylene and thus requires less management, such as dilution for controlled carbon partial pressure and carbon flux.

The growth conditions in the reactor, particularly the flow rates of the hydrogen gas, argon gas, carbon precursor, and the temperature, affect the morphology of the carbon nanotube growth. Hydrogen is introduced to dilute the precursor and to control the decomposition of the hydrocarbon precursor. Thus controlling hydrogen flow can prevent unnecessary excess of carbon within a carbon nanotube growth zone, particularly amorphous carbon. The greater the flow rate of hydrogen gas, the higher the probability of SWCNT growth. Hydrogen and argon act as diluting gases preventing amorphous carbon formation. Argon flow dilutes the carbon precursor and decreases the flux of carbon atoms towards the growth zone. As the flux of carbon atoms decreases the probability of SWCNT growth increases because the hydrogen may prevent the formation of amorphous carbon.

By way of example, and in no way limiting the practice of the invention, the volumetric ratio of argon flowing through a water bubbler to the main argon flow going through the reactor can be between 0.5 and 3, the volumetric ratio of ethylene to argon can be between 0.5 and 1, the volumetric ratio of ethylene to hydrogen can be between 0.5 and 3, and the volumetric ratio of the hydrogen to argon can be between 0.5 to 1. In one preferred embodiment, ethylene is introduced at 200 sccm with argon flowing at 300 sccm, hydrogen flowing at 200 sccm, and argon flowing through the room temperature bubbler at 150 sccm.

An analysis of the effect of water and hydrogen concentrations (ratio) during CVD growth processing on the properties and spinability of the grown CNT conditions and the strength and quality of CNT yarn was made. Chakrabarti, S et al. (Japanese Journal of Applied Physics, 2006, 45, L720-L722) has observed that water and hydrogen play an important role in the growth of superlong aligned brush-like carbon nanotubes. Bronikowski et al. (Carbon, 2006, 44, 2822-2832) has claimed that a high CNT growth rate can be achieved for a $H_2O$ to $C_2H_4$ ratio of 0.25. The water concentration was found to be a very effective variable and a tool for growing long CNT arrays. A high spinability of the CNT arrays was achieved for an $H_2O$ to $C_2H_4$ molar ratio of about 1.2. Control of water vapor concentration helps to obtain the highest CNT growth rate with spinable properties. At high CVD reaction temperature, water vapor appears to act as a weak oxidizer thus inhibiting the growth of and removing amorphous carbon deposited on the catalyst particles. It was observed that the Raman D-band to G-band ratio initially increases with increasing water concentration, with a maximum observed at a $H_2O$ to $C_2H_4$ molar ratio of 1.2, and then the ratio decreases with further increases of water. The existence of such a peak demonstrates that the balance between $H_2O$ and $C_2H_4$ molar ratio of about 1.2 is an important factor for good spinability and a high growth rate of CNT arrays.

An analysis was also made of the effect of hydrogen and carbon concentrations (ratio) during CVD growth processing on the properties and spinability of the grown CNT conditions and the strength and quality of CNT yarn. The hydrogen flow rate was changed from 40 sccm to 195 sccm (standard cubic feet per minute) by keeping the partial pressure of ethylene and total flow rate constant. During this analysis, a maximum growth rate was achieved for a $H_2$ to $C_2H_4$ ratio of 0.08. A slight increase in $H_2$ flow rate (140 sccm) caused a significant decrease in the CNT growth rate. It is known that hydrogen affects the decomposition kinetics of ethylene at elevated temperatures. When the hydrogen fraction is high, the rate of $C_2H_4$ decomposition ($C_2H_4 \rightarrow 2C+2H_2$) is low. The Raman D-band to G-band ratio of CNTs is highest (about 0.8) at the optimized flow rate of hydrogen gas. The purity assessment of CNT was done based on the ratio of the D band peak to G band peak. The G-band is representative of the degree of graphitization associated with nanotube growth, while the D-band indicates the presence of amorphous carbon, disorder, open end other defects in the tubes. The D-band to G-band ratio can be used as a rough measure of CNT quality. From this point of view, CNT arrays obtained by the practice of the present invention and at preferred operating conditions, have reasonable quality because of the low partial pressure of ethylene used. It was observed that the D-band to G-band ratio of Raman spectra decreases from 0.87 to 0.81 due to optimization of the CVD parameters. This ratio is similar to the values reported by other groups producing spinable MWNT arrays.

An aspect of the present invention includes the growing of the CNT at a controlled carbon partial pressure at a level below 0.1, and more typically within the range of 0.65 to 0.70, such as 0.068, which result in predominantly DWCNT and improved the spinability of the CNT array, and improved properties of the CNT elongate structures made therefrom. The low flow of the carbon precursor also inhibits the formation of amorphous carbon, and at even lower flow rates, the growth of SWCNT.

The growth temperature influences the morphology of the carbon nanotube. In general, elevated temperatures increase the surface mobility of the carbon atoms. Thus higher temperatures, preferably between about 800° C. and 1000° C., increase the probability of growing carbon nanotubes having a minimum number of walls. However, high temperatures also increase the decomposition rate of the precursor. The higher decomposition rate may therefore be balanced with an increase in the flow of argon and/or hydrogen gas to control the carbon flux and help prevent formation of amorphous carbon.

One preferred reactor uses a three-zone furnace. The growth is conducted in a middle zone. In the first zone the reactant gases are preheated to for example 450° C. In the third section, the exhaust gases are maintained at a higher temperature, such as 400° C. Thus, the three-zone furnace helps control the temperature in the middle zone.

Improved production of the carbon nanotubes can be achieved by using the composite catalyst layer to regrow multiple arrays 10 on a same substrate without additional processing of the substrate. The CNTs grow from the composite catalyst structures by root growth, with the catalyst remaining affixed to the substrate. After removing the grown carbon nanotubes from the composite catalyst layer, additional carbon nanotubes may be grown on the same composite catalyst layer. The composite catalyst layer is not reprocessed between successive periods of growing carbon nanotubes. By way of example, removing the grown carbon nanotubes from the composite catalyst layer may only require a slight physical pressure, particularly when the carbon nanotubes are in the reactor at elevated temperatures. Growth of additional carbon nanotubes on the composite catalyst layer follows removal of the preceding carbon nanotubes. Thus, a single substrate having a composite catalyst layer may yield multiple (including two, three, four, five, and more) arrays of carbon nanotubes.

The root growth of the CNT array also minimizes the contamination of the CNTs with catalyst material. Typically, the CNTs of the array contain very low levels of catalyst contamination, typically of less than 1% by weight.

The composite catalyst layer 30 can also be deposited on two opposing sides of the substrate 20 for increased productivity. The substrate 20 is oriented, for example on one edge, such that each composite catalyst layer 30 on both sides of the substrate 20 is exposed to the reactant gases. The carbon nanotubes grow according to the previously described procedure; however, the carbon nanotubes grow from each side of the substrate 20 simultaneously. In addition, or alternatively, increased productivity may be obtained by depositing the composite catalyst layer 30 over very large substrates, such as on substrates exceeding tens of centimeters along each dimension. For example, the composite catalyst layer 30 may be deposited with magnetron sputtering onto these large substrates. The composite catalyst layer 30 may also be deposited with CVD technique on these large substrates.

Figure 8:
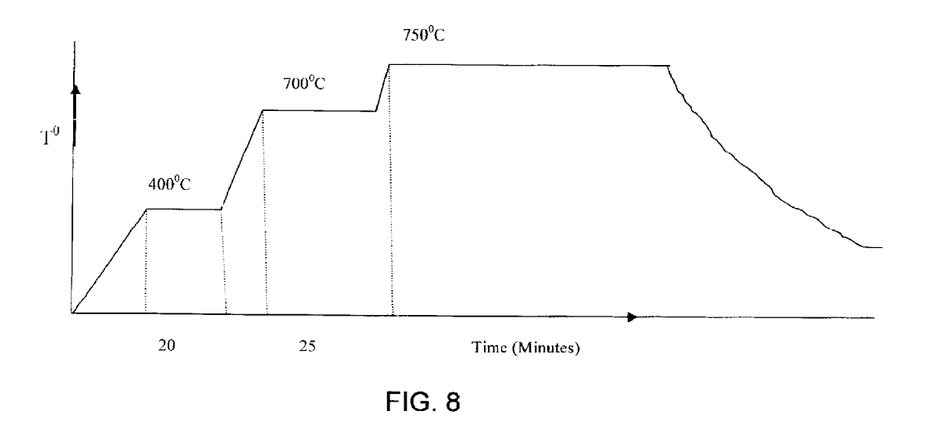
FIG. 8 shows a temperature-time profile during growth of CNTs during chemical vapor deposition (CVD).

FIG. 8 shows a typical set of growth conditions and the furnace temperature profile. The details of the gas flow rates for each portion of the temperature segments are listed in Table 1.

TABLE 1

| Gas | Temp ramp (25-400° C.) sccm | Soak at 400° C. (20 min) sccm | Temp ramp (400-700° C.) sccm | Soak at 700° C. (20 min) sccm | Temp ramp (700-750° C.) sccm | Growth at 750° C. (90 min) Recipe 1 sccm | Growth at 750° C. (90 min) Recipe 2 sccm |
|---|---|---|---|---|---|---|---|
| Ethylene | 0 | 0 | 0 | 0 | 0 | 60 | 100 |
| Argon | 2500 | 2500 | 2500 | 0 | 0 | 1100 | 1300 |
| hydrogen | 0 | 0 | 0 | 450 | 450 | 80 | 100 |
| Water vapor | 0 | 0 | 0 | 0 | 0 | 100 | 120 |
| Total flow | 2500 | 2500 | 2500 | 450 | 450 | 1340 | 1620 |

Figure 9:
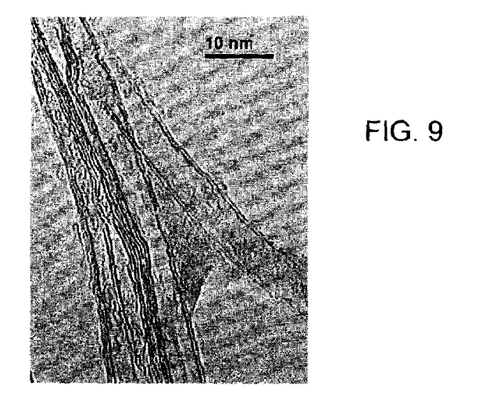
FIG. 9 shows a high resolution transmission electron microscope (HRTEM) image of a bundle of CNTs grown on an iron-cobalt catalyst by CVD.

FIG. 9 shows a high resolution transmission electron microscope (HRTEM) image of a bundle of CNTs grown on an iron-cobalt catalyst by CVD. As nanotubes shown are mostly double-walled, and have outer diameters in the range of 9-12 nm. Some fullerenes are deposited on side walls.

B. Spinning CNTs Elongates

The CNTs grown on the array are drawn into various forms of elongated CNTs. A CNT elongate can include a CNT strand consisting of one or more individual CNTs typically as pulled or drawn from an array, a CNT ribbon typically consisting of a plurality of CNT strands, a CNT thread typically consisting of a one or more CNT ribbons drawn into a single elongated thread, a CNT yarn typically consisting of one or more CNT threads, a CNT braid, or CNT wire or rope.

Figure 11:
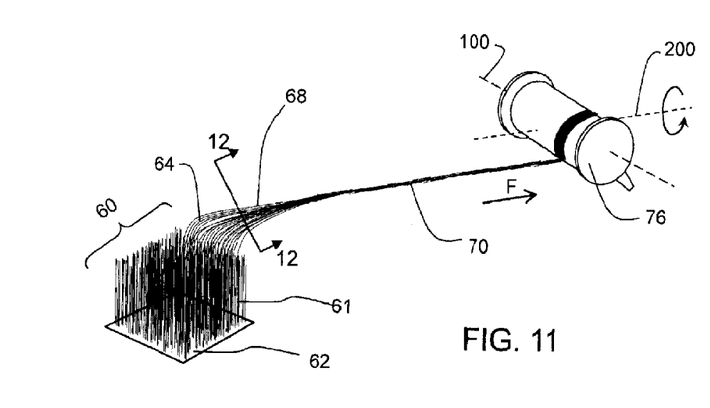
FIG. 11 shows a schematic of CNTs drawn from an array and spun into a CNT thread.
Figure 12:
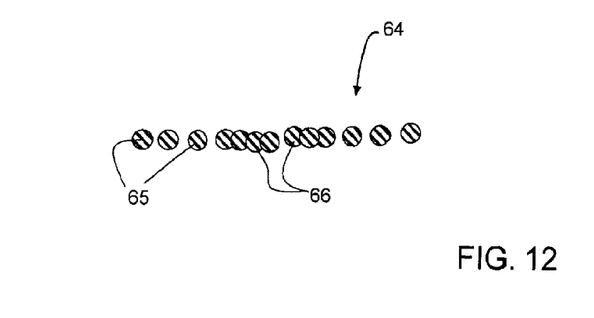
FIG. 12 shows a cross sectional view of CNTs drawn from the array, taken through line 12-12 of FIG. 11.

FIG. 11 shows a schematic of CNTs drawn from an array and spun into a CNT thread. A CNT forest 60 of CNTs 61 are grown on a catalyst substrate 62. The typical height (length) of the aligned CNTs 61 is at least about 0.5 mm (500 nm) to 5 mm, and up to about 2 cm, and more. To initiate a CNT elongate, a bunch 64 of CNTs are pulled from the CNT forest in CNTs strands which can include hundreds to thousands or more of individual CNTs, including drawn strands 65 and laterally-attracted strands 66 of CNTs, as shown in FIG. 12 in cross-section through the ribbon 68. The CNT bunch 64 can be pulled from the forest 60 by grasping the distal tips of CNTs with a tool, such as tweezers. The number of CNTs in the grasped bunch varies with the tip size of the tool or device that grasps the ends of the grown CNTs, as do the diameter or lateral dimensions of the CNT bunch, the resulting CNT ribbon and the resulting CNT thread, substantially as described in Jiang (Nature, vol 419, page 801, Oct. 24, 2002, Nature Publishing Group), the disclosure of which is incorporated herein by reference. The CNTs in the bunch 64 stick to and are pulled by one another by van der Waals forces, and in turn the CNTs in the drawn bunch adhere to and draw out neighboring CNTs on the substrate, which draws away row after row of neighboring CNTs from the forest 60.

With continued application of elongating force F along the longitudinal axis 200, the drawn CNTs associate into one or more CNT ribbon 66. The CNT ribbon can be a broad pattern of adjacent CNT strands, or several groups of CNT strands drawn side-by-side. The elongating force F can be applied by a mechanical means for drawing the CNT elongate through the process, resulting in a CNT thread 70 that is gathered and stored at a collection point, which can include a rotating spool 76. As the CNT ribbon 68 is drawn along by the elongating force F, the CNTs both self-align and compact into the CNT thread 70. The rate of rotation of the spool 76 draws the CNTs from the array at a speed of from about 1 mm to about 1000 mm per minute, more typically at about 10 to about 100 mm per minute. Consequently, the batch-grown forest 60 of CNTs is drawn into a thread 70 in a continuous spinning process. The compaction of the CNTs into the thread 70 can be promoted by twisting of the thread around the longitudinal axis of the CNT thread. This can be accomplished by rotating the revolving spool 76 around a second axis 200 as shown, typically at a revolving rate between 10 and 10,000 rpm, more typically between 100 and 500 rpm.

In one embodiment of the spinning of an array of CNTs into a thread, a uniform array of nanotubes made according to the invention was pulled and twisted into yarn directly from the substrate. The CNT thread was spun directly from the substrate at a pulling speed of 40 mm/min and a twisting (revolving) rate of 250 revolutions per minute (rpm). During the drawing and spinning of CNT arrays, linear motion and alignment of the nanotube bundles that formed the thread were noticed along the length of the CNT bundles and ribbon.

Alternatively, a bunch 64 of CNTs can be drawn from a forest by adhering the distal tips of CNTs of the forest to an adhering surface of a tool, such as a surface of an adhesive tape or adhesive-tipped spatula.

Figure 10:
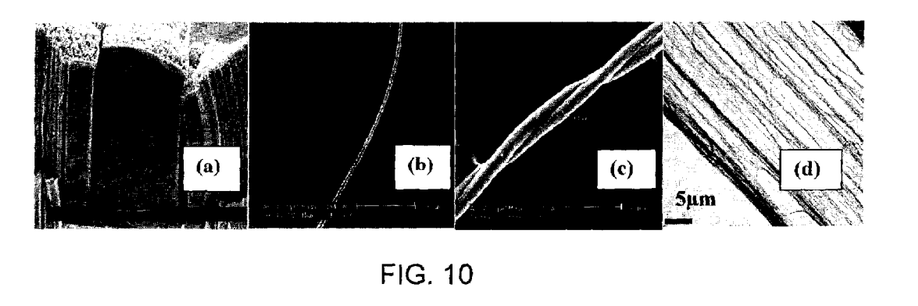
FIG. 10a shows a scanning electron micrograph (SEM) image of an array of CNTs grown and disposed on a substrate.
FIG. 10b shows scanning electron micrograph (SEM) image of a single strand of a CNT pulled from the array.
FIG. 10c shows scanning electron micrograph (SEM) image of a single strand of a double strand of CNT.
FIG. 10d shows scanning electron micrograph (SEM) image of a ribbon of CNT strands drawn from the array.

FIGS. 10a-10d show micrographic (scanning electron microscope, or SEM) images of four different types of CNT-based materials made according to the practice of the present invention. FIG. 10a shows an SEM image of the array of CNTs grown and disposed on a substrate employing an iron and cobalt composite catalyst and CVD. A portion of the CNTs has been pulled away to show the highly-aligned elongated CNTs grown at a high density on the substrate. FIG. 10b shows an SEM image of a single strand of a CNT pulled from the array, having a diameter of about 10-20 micrometers. FIG. 10c shows an SEM image of a double strand thread of CNTs, having a cross-dimension of about 20 micrometers. FIG. 10d shows an SEM image of a ribbon of CNT strands as they are drawn from the CNT array.

Two or more threads can be processed into a yarn. Two or more receiving spools of previously spun and spooled CNT thread can be unwound simultaneously, and the unwound threads can be further spun and wound into a CNT yarn. Each unwinding spool can be independently rotated into either a clockwise or counter-clockwise rotational direction, and the unwound threads pulled together and twisted into the CNT yarn.

The CNTs grown with the iron-cobalt composite catalyst in accordance with the present invention can be drawn from their growth array and spun into a thread more efficiently and effectively with fewer defects and improved mechanical and electrical propertied as compared to CNTs grown from other catalysts, including an iron catalyst and a cobalt catalyst.

In order to facilitate a more complete understanding of the method of the invention, the following non-limiting examples are provided.

Example 1

A 15 nm Al film was deposited by e-beam deposition onto an oxidized single crystal silicon wafer. The $SiO_2$ layer had a thickness of approximately 500 nm. The Al film was converted into aluminum oxide by exposure for about 10 minutes in a radio frequency plasma environment containing about 20 vol. % $O_2$ and about 80 vol. % Ar. The radio frequency plasma power was 300 W and the oxidation was performed at pressure of 60 Torr.

A composite catalyst layer having a thickness of about 2 nm was deposited by e-beam deposition on top of the aluminum oxide. The composite catalyst layer was formed from an alloy of about 50 wt. % iron and about 50 wt. % cobalt.

The substrate and the composite catalyst film were then thermally annealed for 5 hours at 400° C. in air. Following annealing, the substrate was loaded into a CVD reactor to grow a carbon nanotube array. The reactor was purged with about 1000 sccm argon for about 10 minutes at room temperature before the temperature was increased. The substrate and the composite catalyst layer where heated to about 400° C. and held at that temperature for about 20 minutes to permit the argon flow to preheat. To reduce the oxidized composite catalyst layer, the temperature was increased up to 700° C. and a flow of about 200 sccm hydrogen was introduced into the reactor for about 15 minutes. The temperature of the CVD reactor was increased to about 750° C. The substrate and reduced composite catalyst layer were held at that temperature for about 3 hours while several gases were introduced into the reactor to grow the carbon nanotube array.

The following gases and their flow rates were adjusted and introduced into the reactor to grow the carbon nanotube array: ethylene at 200 sccm, Ar at 300 sccm, and water vapor carried by Ar flowing at 150 sccm passing through a room temperature bubbler, and hydrogen at 200 sccm. After 3 hours, the reactor was cooled to room temperature in a flow of 500 sccm Ar. This method produced a CNT array having carbon nanotubes of approximately 5 mm in length.

In another example of the invention, the same catalyst above is deposited onto a stainless steel sheet substrate on which a silica layer is deposited. In yet another example of the invention, the catalysts is replaced with a composite catalyst comprising iron, cobalt, and a lanthanide, and in particular, gadolinium.

Example 2

A composite catalyst layer was deposited onto a silicon substrate prepared as described in Example 1. The composite catalyst layer had a thickness of about 2 nm and was formed from an alloy having an iron to cobalt weight percent ratio of about 50/50.

The substrate and the composite catalyst layer were annealed and reduced according to the procedures described in Example 1. In addition, the nanotubes were grown under conditions similar to the Example 1 conditions and time of ½ hour.

This method produced a CNT array having carbon nanotubes of approximately 0.5 mm in length.

In another example of the invention, the same catalyst above is deposited onto a stainless steel sheet substrate on which a silica layer is deposited. In yet another example of the invention, the catalysts is replaced with a composite catalyst comprising iron, cobalt, and a lanthanide, and in particular, gadolinium.

This has been a description of the present invention along with the preferred method of practicing the present invention. However, the invention itself should only be defined by the appended claims.

We claim:

1. A method of forming an array of aligned, uniform-length carbon nanotubes (CNTs) on a planar surface of a substrate, comprising:
   1) providing a substrate having a planar surface;
   2) depositing a composite catalyst layer on the planar surface, the composite catalyst layer comprising iron and cobalt in an iron to cobalt weight percent ratio of from 20/80 to 50/50;
   3) oxidizing the composite catalyst layer to form an oxidized composite catalyst layer;
   4) reducing the oxidized composite catalyst layer to form a reduced composite catalyst layer; and
   5) growing the array of aligned CNTs on the reduced composite catalyst layer.

2. The method according to claim 1 wherein the composite catalyst layer has a thickness of at least 0.5 nm, and up to 5 nm.

3. The method according to claim 2 wherein the thickness is between 1 nm and 2 nm.

4. The method according to claim 1 wherein forming comprises forming the carbon nanotubes in a chemical vapor deposition reactor.

5. The method according to claim 1 wherein depositing comprises depositing iron and cobalt onto the planar surface simultaneously, or as a plurality of alternating layers of iron and cobalt onto the planar surface.

6. The method according to claim 1 wherein the composite catalyst layer comprises at least approximately 5 wt. % of iron, and up to about 95 wt. % of iron.

7. The method according to claim 1 wherein the deposited composite catalyst layer is a discontinuous layer having a pattern comprising a plurality of coated areas separated by approximately 0.01 mm to approximately 3 mm in distance by an uncoated area.

8. The method according to claim 1 wherein during oxidizing the composite catalyst layer is heated to an annealing temperature of between 300° C. and 900° C.

9. The method according to claim 1 wherein the substrate comprises a layered structure comprising the successive layers of silicon, silicon dioxide, and aluminum oxide, and optionally includes a plurality of the planar surfaces.

10. A method of forming a carbon nanotube CNT thread comprising a plurality of CNTs, comprising:
   1) growing an array of aligned CNTs on a planar surface of a substrate, comprising:
      i) providing a substrate having a planar surface;
      ii) depositing a composite catalyst layer on the planar surface, the composite catalyst layer comprising iron and cobalt in an iron to cobalt weight percent ratio of from 20/80 to 50/50;
      iii) oxidizing the composite catalyst layer to form an oxidized composite catalyst layer;
      iv) reducing the oxidized composite catalyst layer to form a reduced composite catalyst layer; and
      v) growing the array of aligned CNTs on the reduced composite catalyst layer;
   2) drawing a plurality of the grown, aligned CNTs from the array of aligned CNTs into a ribbon of CNTs along an axis line; and
   3) spinning the ribbon of CNTs about the axis line to form a CNT thread.

11. The method according to claim 7 wherein the coated areas are about 1 mm in diameter.

12. The method according to claim 8 wherein during reducing the oxidized composite catalyst layer is heated to between 600° C. and 800° C. in a reducing gas.

13. The method according to claim 1 wherein the iron to cobalt weight percent ratio is 20/80.

14. The method according to claim 1 wherein the iron to cobalt weight percent ratio is 50/50.

15. The method according to claim 10 wherein the iron to cobalt weight percent ratio is 20/80.

16. The method according to claim 10 wherein the iron to cobalt weight percent ratio is 50/50.

17. The method according to claim 1 wherein the aligned CNTs are predominantly double-walled CNTs.

18. The method according to claim 1 wherein depositing a composite catalyst layer includes depositing an alloy of catalytic elements including iron and cobalt.

* * * * *